United States Patent
Wu et al.

(10) Patent No.: US 6,798,287 B2
(45) Date of Patent: Sep. 28, 2004

(54) RADIO FREQUENCY POWER AMPLIFIER MODULE INTEGRATED WITH A POWER CONTROL HOOP

(75) Inventors: Janne-wha Wu, Chiai (TW); Cheng-chi Hu, Tainan (TW); Ying-chou Shih, Tainan (TW)

(73) Assignee: Delta Electronics, Inc. (TW)

( * ) Notice: Subject to any disclaimer, the term of this patent is extended or adjusted under 35 U.S.C. 154(b) by 86 days.

(21) Appl. No.: 10/356,410

(22) Filed: Jan. 31, 2003

(65) Prior Publication Data

US 2004/0108895 A1 Jun. 10, 2004

(30) Foreign Application Priority Data

Dec. 10, 2002 (TW) .......................................... 91135766

(51) Int. Cl.⁷ .............................................. H03G 3/20
(52) U.S. Cl. ........................ 330/129; 330/66; 330/140
(58) Field of Search ............................. 330/65, 66, 67, 330/68, 129, 140, 289, 295, 302

(56) References Cited

U.S. PATENT DOCUMENTS

| 6,624,703 B1 | * | 9/2003 | Chang et al. ............... 330/307 |
| 6,741,125 B2 | * | 5/2004 | Arai et al. .................... 330/66 |
| 2004/0012442 A1 | * | 1/2004 | Ichitsybo et al. ........... 330/129 |

* cited by examiner

Primary Examiner—Steven J. Mottola
(74) Attorney, Agent, or Firm—Martine & Penilla, LLP

(57) ABSTRACT

A radio frequency (RF) power amplifier module integrated with a power control loop is formed on a print circuit board and packaged within a mold. In order to minimize a whole size of the RF power amplifier module, capacitors with a smaller size are employed to substitute for prior art ceramic directional couplers. In addition to the capacitors, RF power amplifiers, matching circuits, power detectors, and a power control specific application integrated circuit are all integrated on the print circuit board without individual packages. Furthermore, the RF power amplifiers and the power detectors are formed on a common semiconductor substrate. Therefore, the RF power amplifier module has advantages of a small size and minimum parasitic impedance.

9 Claims, 2 Drawing Sheets

RADIO FREQUENCY POWER AMPLIFIER MODULE INTEGRATED WITH A POWER CONTROL HOOP

BACKGROUND OF THE INVENTION

1. Field of the Invention

The present invention relates to a radio frequency amplifier module and, more particularly, to a radio frequency amplifier module integrated with a power control loop, which is relatively small in size and relatively low in parasitic impedance.

2. Description of the Related Art

Typically, radio frequency (RF) power amplifiers employed in transmitters of mobile terminals are classified into three groups: (1) discrete transistor line-ups, (2) monolithic microwave integrated circuits (MMICs), and (3) RF power amplifier modules. Of these three groups, the discrete transistor line-ups have been employed earliest, which have two primary disadvantages: (1) mobile phone manufacturers must design appropriate RF power amplifiers himself and (2) print circuit boards to be used must provide a relatively large area. These disadvantages result in a longer period of time for the RF power amplifiers to become available in commercial and industrial markets. In addition, design flexibility associated with the RF power amplifiers suffers from a number of parasitic impedances in the discrete transistor line-ups. Possible influences caused by the parasitic impedances become more complicated especially when an operation frequency gets higher, such as 1 GHz and more.

As a countermeasure to the problem regarding the parasitic impedances of the discrete transistor line-ups, the MMIC RF power amplifiers have been developed. The MMIC RF power amplifiers have smaller parasitic impedances as compared with the discrete transistor line-ups. However, sometimes in order to compromise processing variations and to reduce cost, some matching circuits such as output matching circuits are not directly integrated into the MMIC chips. This is referred to as partially matched MMICs. In this case, the uncompleted portion of the matching circuit is left behind as a task of mobile phone manufacturers to deal with.

In recent years, the power amplifier modules are widely applied to the transmitters of the mobile terminals. A main advantage of the power amplifier modules is a possibility to combine various technologies such as band selection switches and power control loops, thereby enhancing their own performance so as to meet requirements of future broadband systems such as code division multiple access (CDMA).

FIG. 1 is a schematic diagram showing a transmitter of a GSM mobile terminal provided with a conventional RF power amplifier module and a conventional power control loop. Referring to FIG. 1, in addition to a conventional RF power amplifier module 10, a transmitter of a GSM mobile terminal includes a power control loop consisting of two ceramic directional couplers 22 and 26, two attenuators 24 and 28, three power detectors 32, 34, and 36, and a power control application specific integrated circuit (ASIC) 60. The conventional RF power amplifier module 10 is formed with two RF power amplifiers 12 and 14, which are applied to different frequency bands, respectively.

More specifically, a radio frequency signal RF is input to an appropriate one of the RF power amplifiers 12 and 14 of the conventional RF power amplifier module 10 and then is radiated out from an antenna 50 through a power combiner 40. The RF power radiated from the antenna 50 has a level which is determined by a distance between a base station and a mobile terminal. Once the output level is selected, a control signal CS is sent out from a base band side for controlling the level of the RF power. However, in order to comply with regulations of the Federal Communications Commission (FCC), it is necessary to use the power control loop for accurately controlling the level of the RF power as will be described later.

In the power control loop shown in FIG. 1, the ceramic directional couplers 22 and 26 retrieve parts of the output power from the conventional RF power amplifier module 10 as power representation signals for indicating the level of the output power and then sends the power representation signals to the power detectors 32 and 34 through the attenuators 24 and 28, respectively. The attenuators 24 and 28 are optional and are used for adjusting the power representation signals. With the power detectors 32 and 34, the power representation signals are interpreted as voltage level signals. These voltage level signals are applied to the power control ASIC 60. Moreover, in order to eliminate influence caused by temperature variations on the power detectors 32 and 34, the power detector 36 is additionally connected between the power control ASIC 60 and ground for inputting a reference signal to the power control ASIC 60. The power control ASIC 60 compares the control signal CS from the base band side, the power representation signals from the power detectors 32 and 34, and the reference signal from the power detector 36, and then outputs power adjustment signals to the RF power amplifiers 12 and 14 of the RF power amplifier module 10 so as to adjust bias conditions of the RF power amplifiers 12 and 14 for obtaining desired power levels.

Since the conventional RF power amplifier 10 and each of the components of the power control loop have their own packages and are separate devices from each other, the transmitter of the conventional mobile terminal is relatively large in size and fails to meet a demand of size reduction. Moreover, because many wirings are used for interconnections between the discrete packages, the parasitic impedances such as wiring inductances and capacitances under bonding pads are inevitably generated, resulting in deteriorations of the operation speed and reliability of the conventional mobile terminal.

SUMMARY OF THE INVENTION

In view of the above-mentioned problem, an object of the present invention is to provide an RF power amplifier module, in which a power control loop is integrated, thereby achieving a relatively small size and minimum parasitic impedance.

According to one aspect of the present invention, an RF power amplifier module, which is formed on a print circuit board and packaged within a mold, includes: at least one RF power amplifier formed on a first semiconductor substrate for outputting a power signal; at least one matching circuit connected to the at least one RF power amplifier for output matching; at least one capacitor connected to the at least one matching circuit for retrieving part of the power signal as a power representation signal; at least one power detector formed on the first semiconductor substrate and connected to the at least one capacitor for interpreting the power representation signal as a voltage level signal; and a power control application specific integrated circuit (ASIC) formed on a second semiconductor substrate for receiving a power control signal from outside and the voltage level signal and outputting a power adjustment signal to the at least one RF power amplifier based on a result of comparison between the power control signal and the voltage level signal, wherein the at least one RF power amplifier, the at least one power detector, and the power control ASIC are mounted on the print circuit board in forms of bare dies.

In order to minimize the whole size, the RF power amplifier module according to the present invention employs the capacitor with a relatively small size in place of the prior art ceramic directional coupler. In addition to the capacitor, the RF power amplifier, the matching circuit, the power detector, and the power control ASIC are all integrated on the print circuit board without individual, discrete packages. Furthermore, the RF power amplifier and the power detector may be formed on a common semiconductor substrate. Therefore, the RF power amplifier module according to the present invention is integrated with the power control loop and has advantages of a small size and minimum parasitic impedance.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 2:
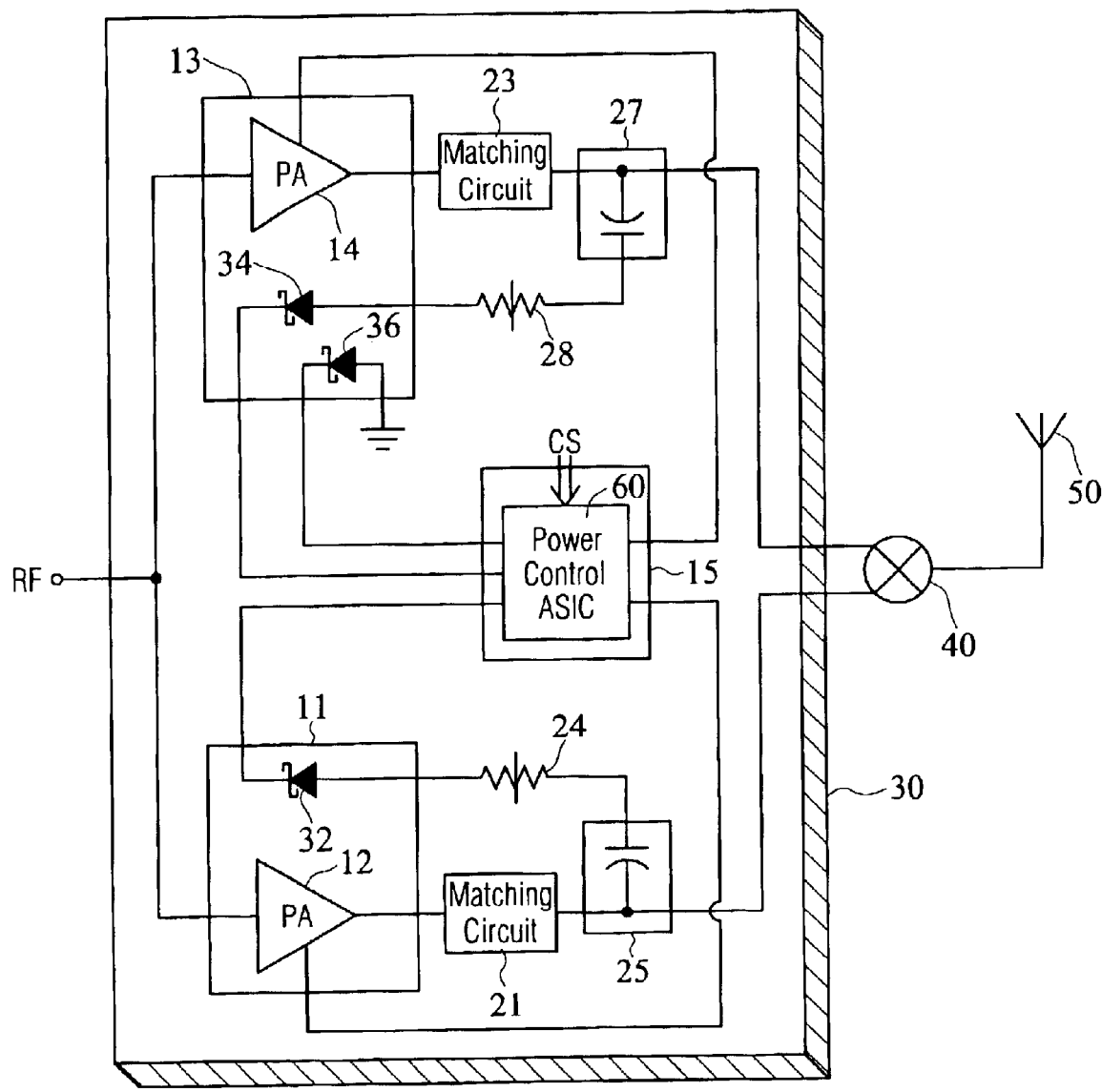
FIG. 2 is a schematic diagram showing an RF power amplifier module integrated with a power control loop according to the present invention.

FIG. 2 is a schematic diagram showing an RF power amplifier module integrated with a power control loop according to the present invention. Referring to FIG. 2, the RF power amplifier module integrated with the power control loop primarily includes: a first RF power amplifier 12 and a second RF power amplifier 14; a first matching circuit 21 and a second matching circuit 23; a first capacitor 25 and a second capacitor 27; a first attenuator 24 and a second attenuator 28; a first power detector 32 and a second power detector 34; a temperature compensation power detector 36; and a power control ASIC 60. The RF power amplifier module integrated with the power control loop according to the present invention is assembled on a print circuit board 30 and is packaged within a mold (not shown). In other words, all of the components described above are mounted on the common print circuit board 30, interconnected with each other through wirings provided on the common print circuit board 30, and packaged as a whole within the mold (not shown).

The first and second RF power amplifiers 12 and 14 are formed on two semiconductor substrates 11 and 13, respectively, by the MMIC technology. The semiconductor substrates 11 and 13 may be made of GaAs. For example, the first and second RF power amplifiers 12 and 14 are applied in a relatively low frequency band (824 to 849 MHz and 880 to 915 MHz) and a relatively high frequency band (1710 to 1785 MHz and 1850 to 1910 MHz), respectively. Consequently, the first and second RF power amplifiers 12 and 14 may be used in an application of quad-band GSM mobile terminals.

On the other hand, the power control ASIC 60 is formed on a semiconductor substrate 15 by the complementary metal oxide semiconductor (CMOS) technology. The semiconductor substrate 15 may be made of Si. According to the present invention, the semiconductor substrates 11 and 13, on which the first and second RF power amplifiers 12 and 14 are formed, and the semiconductor substrate 15, on which the power control ASIC is formed, are mounted on the print circuit board 30 in a form of bare dies without packages. In this way, the present invention avoids unnecessary packages, thereby saving much space and reducing the whole size of the RF power amplifier module.

The first and second matching circuits 21 and 23 are connected to output terminals of the first and second RF power amplifiers 12 and 14 for a purpose of output matching.

Figure 1:
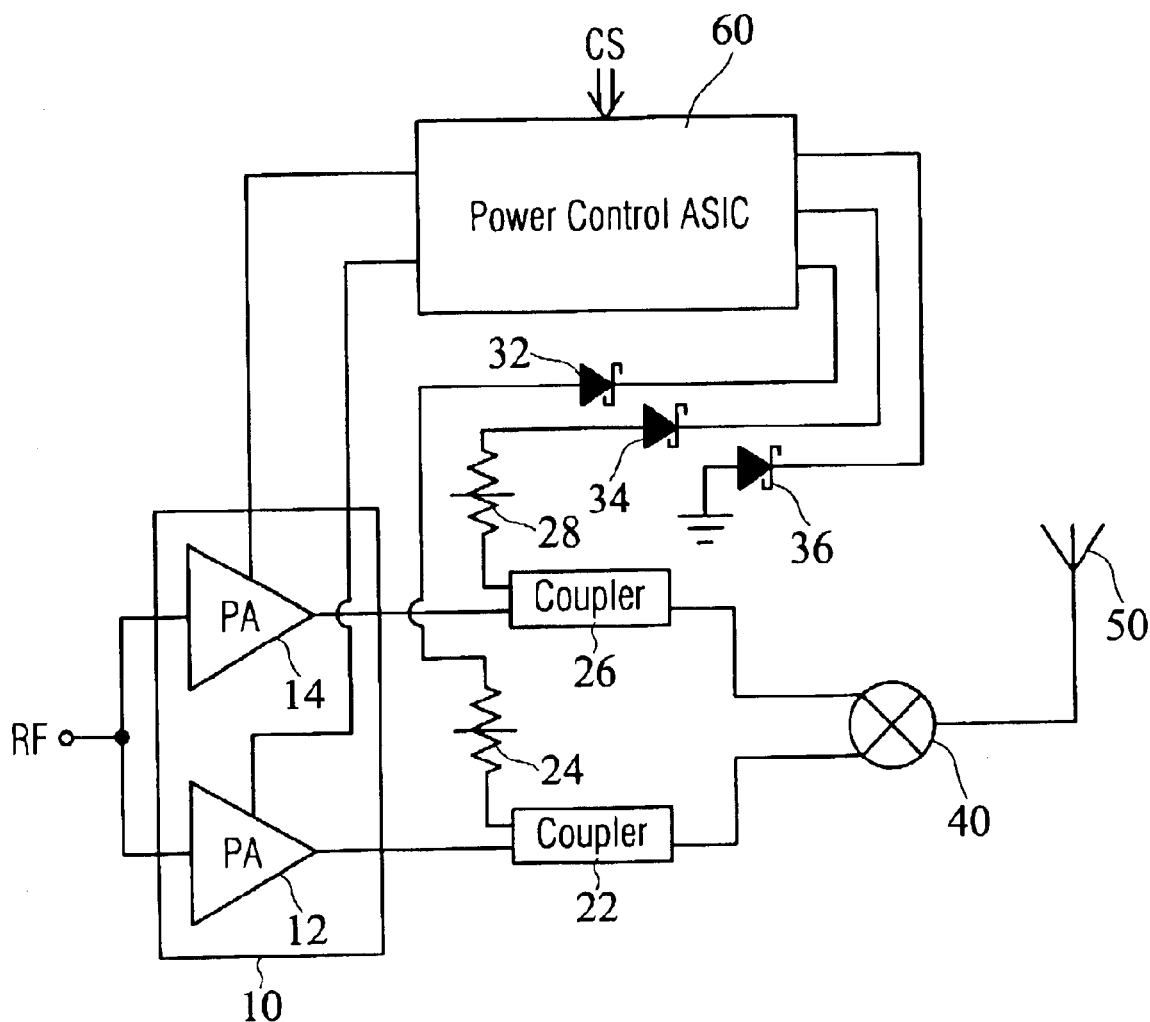
FIG. 1 is a schematic diagram showing a conventional RF power amplifier module and a conventional power control loop.

In order to minimize the whole size, the RF power amplifier module according to the present invention employs the first and second capacitors 25 and 27, in place of the ceramic directional couplers 22 and 26 shown in FIG. 1, for retrieving parts of the output powers from the first and second RF power amplifiers 12 and 14 as the power representation signals. For example, each of the ceramic directional couplers 22 and 26 has a size of about 0.8 mil×0.5 mil, whereas each of the first and second capacitors 25 and 27 has a size of about 0.4 mil×0.2 mil. In other words, the size of the capacitor according to the present invention is one fifth of that of the prior art ceramic directional coupler 22 or 26.

The first and second attenuators 24 and 28 are optional and are used for adjusting the power representation signals retrieved by the first and second capacitors 25 and 27. For example, each of the first and second attenuators 24 and 28 may be formed by a microstrip line with high impedance.

The first and second power detectors 32 and 34 are formed by Schottky diodes. As shown in FIG. 2, the first power detector 32 may be formed on the semiconductor substrate 11 together with the first RF power amplifier 12 and the second detector 34 may be formed on the semiconductor substrate 13 together with the second RF power amplifier 14, thereby saving much space and reducing the size of the RF power amplifier module. The power representation signals from the first and second capacitors 25 and 27 are sent to the first and second power detectors 32 and 34 through the first and second attenuators 24 and 28, respectively, and then are interpreted as voltage level signals. These voltage level signals are applied to the power control ASIC 60.

Since the interpretations between the power representation signals and voltage level signals performed by the first and second power detectors 32 and 34 are influenced by temperature variations, the temperature compensation power detector 36 is connected between the power control ASIC 60 and ground for inputting a reference signal to the power control ASIC 60, thereby compensating the temperature variations. As shown in FIG. 2, the temperature compensation power detector 36 is also a Schottky diode formed on the semiconductor substrate 13.

In the prior art shown in FIG. 1, the RF power amplifier module and the power control loop are separate from each other and have individual packages. Also, the power control loop is configured by separate components with their own packages. Therefore, the prior art RF power amplifier module and power control loop have a relatively large size and an effect of additional parasitic impedances.

However, in the RF power amplifier module according to the present invention shown in FIG. 2, the RF power amplifiers 12 and 14, the matching circuits 21 and 23, the capacitors 25 and 27, the attenuators 24 and 28, the power detectors 32, 34, and 36, and the power control ASIC 60 are all integrated on the print circuit board 30 without individual, discrete packages. Furthermore, the RF power amplifiers 12 and 14 as well as the power detectors 32, 34, and 36 may be formed on the common semiconductor substrate. Therefore, the RF power amplifier module according to the present invention is integrated with the power control loop and has the advantages of the small size and minimum parasitic impedance.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A radio frequency (RF) power amplifier module, which is formed on a print circuit board and packaged within a mold, comprising:

at least one RF power amplifier formed on a first semiconductor substrate for outputting a power signal;

at least one matching circuit connected to the at least one RF power amplifier for a purpose of output matching;

at least one capacitor connected to the at least one matching circuit for retrieving part of the power signal as a power representation signal;

at least one power detector formed on the first semiconductor substrate and connected to the at least one capacitor for interpreting the power representation signal as a voltage level signal; and a power control application specific integrated circuit (ASIC) formed on a second semiconductor substrate for receiving a power control signal from outside and the voltage level signal, and outputting a power adjustment signal to the at least one RF power amplifier based on a result of comparison between the power control signal and the voltage level signal, wherein the at least one RF power amplifier, the at least one power detector, and the power control ASIC are mounted on the print circuit board in a form of bare dies.

2. The RF power amplifier module according to claim 1, further comprising:

at least one attenuator connected between the at least one capacitor and the at least one power detector for adjusting the power representation signal.

3. The RF power amplifier module according to claim 1, wherein:

each of the at least one attenuator is formed by a microstrip line with high impedance.

4. The RF power amplifier module according to claim 1, wherein:

the first semiconductor substrate is made of GaAs.

5. The RF power amplifier module according to claim 1, wherein:

the second semiconductor substrate is made of Si.

6. The RF power amplifier module according to claim 1, wherein:

each of the at least power detector is formed by a Schottky diode.

7. The RF power amplifier module according to claim 1, further comprising:

a temperature compensation power detector connected between the power control ASIC and ground for inputting a reference signal to the power control ASIC, thereby performing temperature compensation.

8. The RF power amplifier module according to claim 7, wherein:

the temperature compensation power detector is formed by a Schottky diode.

9. The RF power amplifier module according to claim 7, wherein:

the temperature compensation power detector is formed on the first semiconductor substrate.

* * * * *